US012749647B2

(12) United States Patent
Choi et al.

(10) Patent No.: US 12,749,647 B2
(45) Date of Patent: Sep. 29, 2026

(54) FOCUSED ION BEAM APPARATUS AND CONTROL METHOD THEREOF

(71) Applicant: Samsung Electronics Co., Ltd., Suwon-si (KR)

(72) Inventors: Yeoseon Choi, Suwon-si (KR); Donghoon Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 372 days.

(21) Appl. No.: 18/504,630

(22) Filed: Nov. 8, 2023

(65) Prior Publication Data

US 2024/0282548 A1 Aug. 22, 2024

(30) Foreign Application Priority Data

Feb. 21, 2023 (KR) ........................ 10-2023-0023101
May 2, 2023 (KR) ........................ 10-2023-0056934

(51) Int. Cl.
*H01J 37/16* (2006.01)
*H01J 37/08* (2006.01)
*H01J 37/18* (2006.01)

(52) U.S. Cl.
CPC .............. *H01J 37/16* (2013.01); *H01J 37/08* (2013.01); *H01J 37/18* (2013.01); *H01J 2237/022* (2013.01); *H01J 2237/1825* (2013.01)

(58) Field of Classification Search
CPC .. H01J 37/16; H01J 37/18; H01J 37/08; H01J 2237/022; H01J 2237/1825; H01J 2237/31749
See application file for complete search history.

(56) References Cited

U.S. PATENT DOCUMENTS 6,398,198 B1 * 6/2002 Okamoto ........... B60G 17/0521 267/122
7,171,918 B2 2/2007 Gavish et al.
9,576,767 B2 2/2017 Bhattacharjee et al.
10,312,049 B2 6/2019 Cho et al.
2001/0032939 A1 10/2001 Gerlach et al.
2001/0044156 A1 * 11/2001 Kelly ....................... G01N 1/32 435/40.5
2002/0084426 A1 7/2002 Gerlach et al.
2005/0086946 A1 4/2005 Song et al.
2014/0292189 A1 * 10/2014 Aramaki ................ H01J 37/08 315/1

(Continued)

FOREIGN PATENT DOCUMENTS

EP 1111471 A2 * 6/2001 ........... G03F 7/0716

OTHER PUBLICATIONS

Ali Taghizadeh, et. al "Conductive polymers in water treatment: A review" Journal of Molecular Liquids vol. 312, Aug. 15, 2020, 113447.

(Continued)

*Primary Examiner* — David E Smith
(74) *Attorney, Agent, or Firm* — Harness, Dickey & Pierce, P.L.C.

(57) ABSTRACT

A focused ion beam apparatus may include an ion beam emitter for emitting an ion beam, a focused ion beam chamber into which ion gas may be introduced, a sample stage in the focused ion beam chamber to support a wafer sample, and an air bag in the focused ion beam chamber. The airbag may be positioned to not interfere with the sample stage.

20 Claims, 9 Drawing Sheets

(56) References Cited

U.S. PATENT DOCUMENTS

| | | | | |
|---|---|---|---|---|
| 2014/0312245 | A1 | 10/2014 | Smith et al. | |
| 2015/0348744 | A1* | 12/2015 | Uchida | H01J 37/3174<br>430/296 |

OTHER PUBLICATIONS

Ehsan Nazarzadeh Zare, et. al "Nanoadsorbents based on conducting polymer nanocomposites with main focus on polyaniline and its derivatives for removal of heavy metal ions/dyes: A review" Environmental Research vol. 162, Apr. 2018, pp. 173-195.

* cited by examiner

FOCUSED ION BEAM APPARATUS AND CONTROL METHOD THEREOF

CROSS-REFERENCE TO RELATED APPLICATION(S)

This application claims benefit of priority to Korean Patent Application Nos. 10-2023-0023101 (filed on Feb. 21, 2023) and 10-2023-0056934 (filed on May 2, 2023), each filed in the Korean Intellectual Property Office, the disclosures of each of which are incorporated herein by reference in their entireties.

BACKGROUND

Inventive concepts relate to a focused ion beam apparatus and a control method thereof.

As devices for observing images of samples of semiconductor wafers, a scanning electron microscopy (SEM) device using electron beams has been widely known. Also, devices for processing samples use gallium ions emitted from a liquid metal ion source. Devices for processing samples with focused ion beams have been used to observe a cross-section of a certain portion of a sample by the SEM, manufacture transmission electron microscopy (TEM) samples, change wirings of semiconductor, and correct patterns of masks for semiconductor lithography.

When using focused ion beam apparatuses, a piece wafer sample may be loaded on a stage holder and then transported into a focused ion beam chamber. At this time, the focused ion beam chamber may be evacuated using a pump. The process of evacuating the focused ion beam chamber may take a considerable amount of time. In addition, processing operations, such as depositing by injecting various gases into the focused ion beam chamber and milling various materials with ion beams, may be performed. Thus, there may be many molecules present in the focused ion beam chamber that may contaminate a flake wafer sample surface.

Research may be needed on reducing a process time for evacuating the focused ion beam chamber and removing causes of interference with sample analysis due to deposition of molecules remaining in the focused ion beam chamber on the sample.

SUMMARY

An aspect of inventive concepts is to provide a focused ion beam apparatus for shortening a process time for evacuating a focused ion beam chamber.

Another aspect of inventive concepts is to provide a focused ion beam apparatus for limiting and/or preventing molecules remaining in a focused ion beam chamber from being deposited on a sample.

Another aspect of inventive concepts is to provide a control method of a focused ion beam apparatus for reducing a process time for evacuating a focused ion beam chamber.

According to an embodiment of inventive concepts, a focused ion beam apparatus may include an ion beam emitter configured to emit an ion beam; a focused ion beam chamber for having ion gas introduced therein; a sample stage in the focused ion beam chamber, the sample stage being configured to support a wafer sample; and an airbag in the focused ion beam chamber, the airbag arranged to not interfere with the sample stage.

According to an embodiment of inventive concepts, a focused ion beam apparatus may include a focused ion beam chamber in which a sample stage configured to support a wafer sample is disposed; and an airbag in the focused ion beam chamber, the airbag being configured to inflate to reduce an effective volume in the focused ion beam chamber.

According to an embodiment of inventive concepts, a method of controlling a focused ion beam apparatus may include attaching a wafer sample on a sample stage in a focused ion beam chamber; filling an airbag with air, the airbag being installed in a position in the focused ion beam chamber that does not interfere with the sample stage; and evacuating the focused ion beam chamber after filling the airbag with air.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Figure 1:
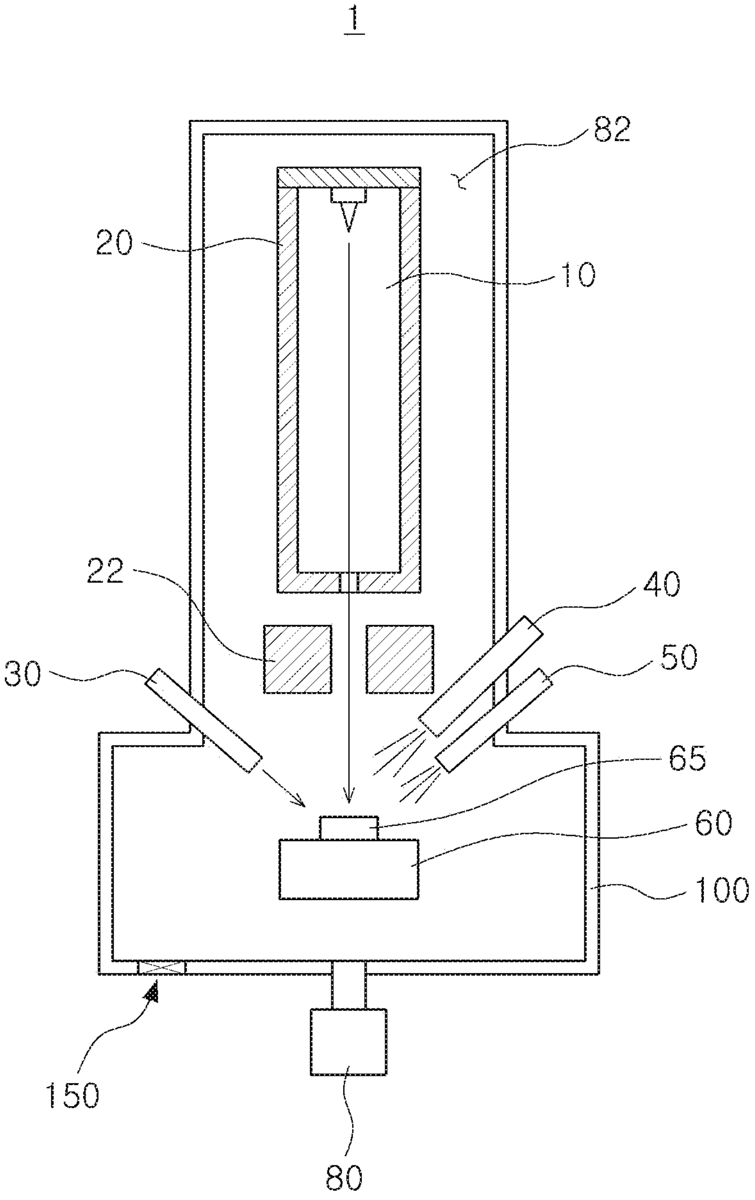
FIG. 1 is a schematic diagram of a focused ion beam apparatus according to an example of inventive concepts.

Hereinafter, embodiments in inventive concepts will be described in detail with reference to the accompanying drawings.

The embodiments of inventive concepts may be modified into other forms and are provided so that this disclosure will be thorough and complete and will fully convey the scope of inventive concepts to those of ordinary skill in the art. In the drawings, the shapes and dimensions of elements may be exaggerated for clarity, and like reference numerals denote like elements.

In inventive concepts, the meaning of a “connection” of a component to another component includes an indirect connection through another element as well as a direct connection between two components. In addition, in some cases, the meaning of “connection” includes all “electrical connections.”

It may be understood that when an element is referred to with “first” and “second,” the element is not limited as a result. The terms “first” and “second” and like terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The terms used in inventive concepts are used to simply describe an example and are not intended to limit the scope of inventive concepts. A singular term may include a plural form unless otherwise indicated.

Focused Ion Beam Apparatus

Figure 2:
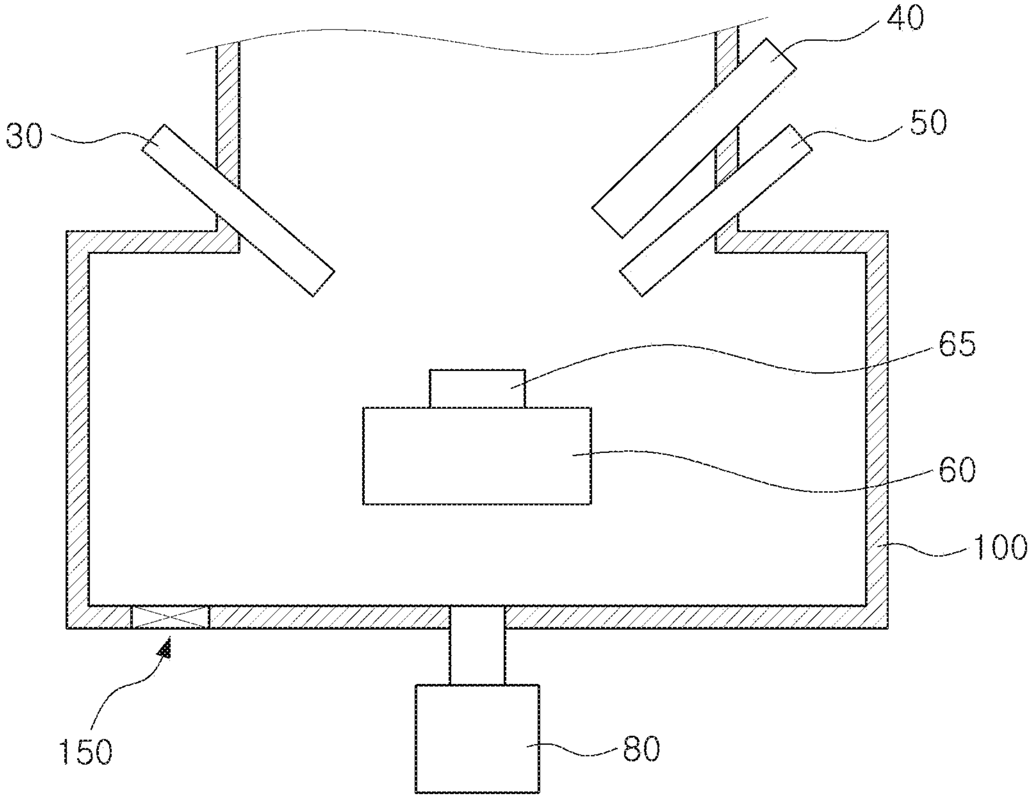
FIG. 2 is a schematic diagram of a focused ion beam chamber equipped with an airbag according to example embodiments used in the focused ion beam apparatus of FIG. 1 is installed.

FIG. 1 is a schematic diagram of a focused ion beam apparatus according to an example of inventive concepts, and FIG. 2 is a schematic diagram of a focused ion beam chamber used in the focused ion beam apparatus of FIG. 1 in which an airbag according to according to example embodiments is installed.

Referring to FIGS. 1 and 2, a focused ion beam apparatus 1 according to an example of inventive concepts includes an ion beam emitter 20 (e.g., ion gun), a ring 22, a focused ion beam chamber 100, an upper chamber 82, a sample stage 60, and an airbag 150.

The ion beam emitter 20 emits an ion beam for processing a wafer sample 65 located in the focused ion beam chamber 100 with the ion beam. The ion beam emitted from the ion beam emitter 20 may be generated using nitrogen having a high sputtering effect. Meanwhile, the ion beam may be generated using a light element, such as helium, to obtain an observation image of the wafer sample.

The focused ion beam chamber 100 communicates with an ion beam channel 10 in which the ion beam emitter 20 is installed, and is a space in which the wafer sample 65 to be analyzed is loaded. The focused ion beam chamber 100 is connected to a scanning electron microscope (SEM) 30 for observing images of the wafer sample 65. In addition, a processing device 40 (e.g., Ga ion gun) using a gallium (Ga) ion beam and a gas injector 50 (e.g., nozzle) for spraying gas in the vicinity of the wafer sample 65 are also connected to the focused ion beam chamber 100.

The wafer sample 65 to be analyzed is loaded on the sample stage 60, and the sample stage 60 is moved into the focused ion beam chamber 100. The sample stage 60 may be tilted or rotated for convenience in processing, testing, and analyzing wafer samples. A motor (not shown) may be used to rotate or tilt the sample stage 60.

The airbag 150 is installed in a position to not interfere with the sample stage 60 supporting the wafer sample 65 in the focused ion beam chamber 100. As illustrated, the airbag 150 may be embedded in the bottom of the focused ion beam chamber 100 or installed to be exposed.

Figure 3:
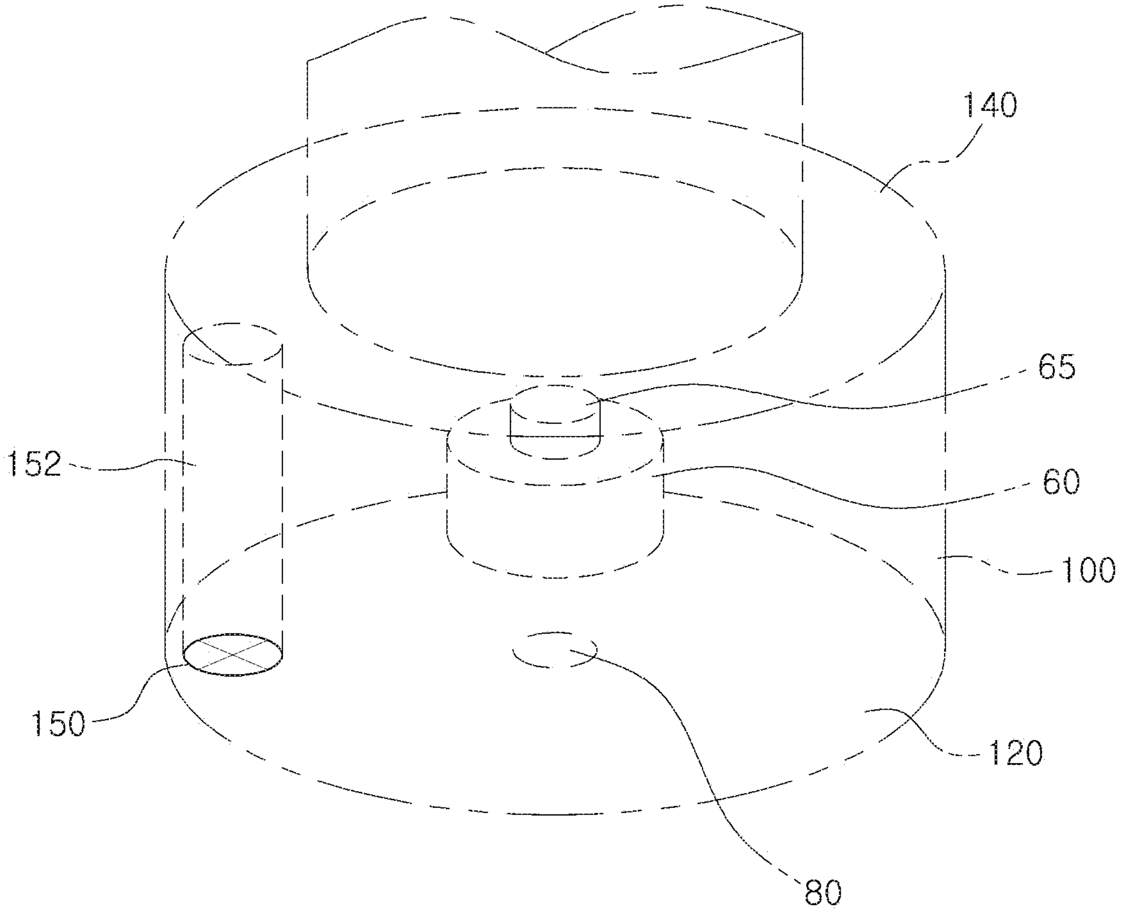
FIG. 3 is a schematic diagram of an activated state of the airbag according to example embodiments in the focused ion beam chamber of FIG. 2.

FIG. 3 is a schematic diagram of an activated state of an airbag according to example embodiments in the focused ion beam chamber of FIG. 2.

Referring to FIG. 3, a single airbag 150 according to example embodiments may be installed in the outer periphery of the sample stage 60, and air is injected to inflate the airbag 150. The inflated airbag 152 may reduce a total volume within the focused ion beam chamber 100 by the inflated volume of the airbag. The focused ion beam chamber 100 may have an upper surface 140. The air used to inflate the airbag 150 may include a single gas, a mixture of gases (e.g., a mixture including mainly nitrogen and oxygen), one or more inert gases (e.g., argon, nitrogen), or a combination thereof, but example embodiments are not limited thereto.

Figure 4:
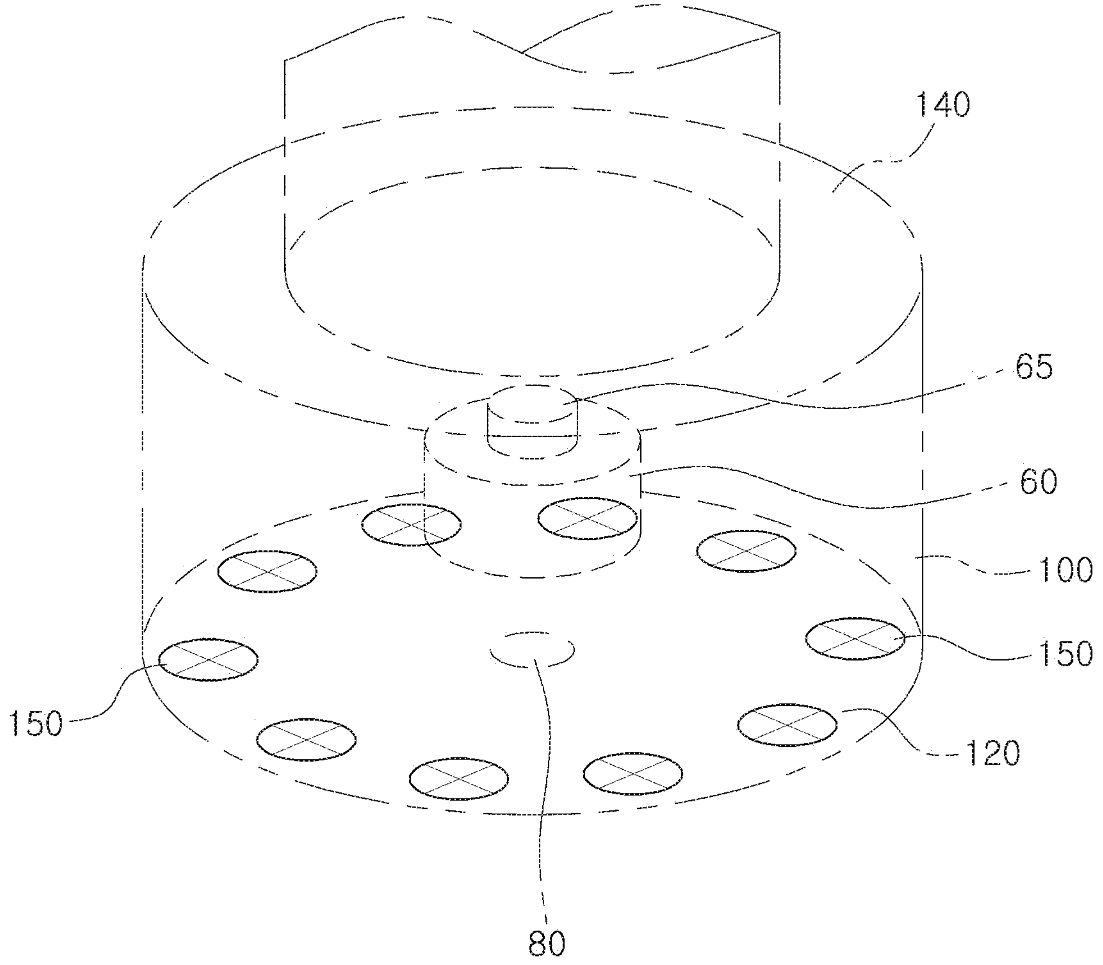
FIG. 4 is a schematic diagram of a focused ion beam chamber equipped with an airbag according to example embodiments.
Figure 5:
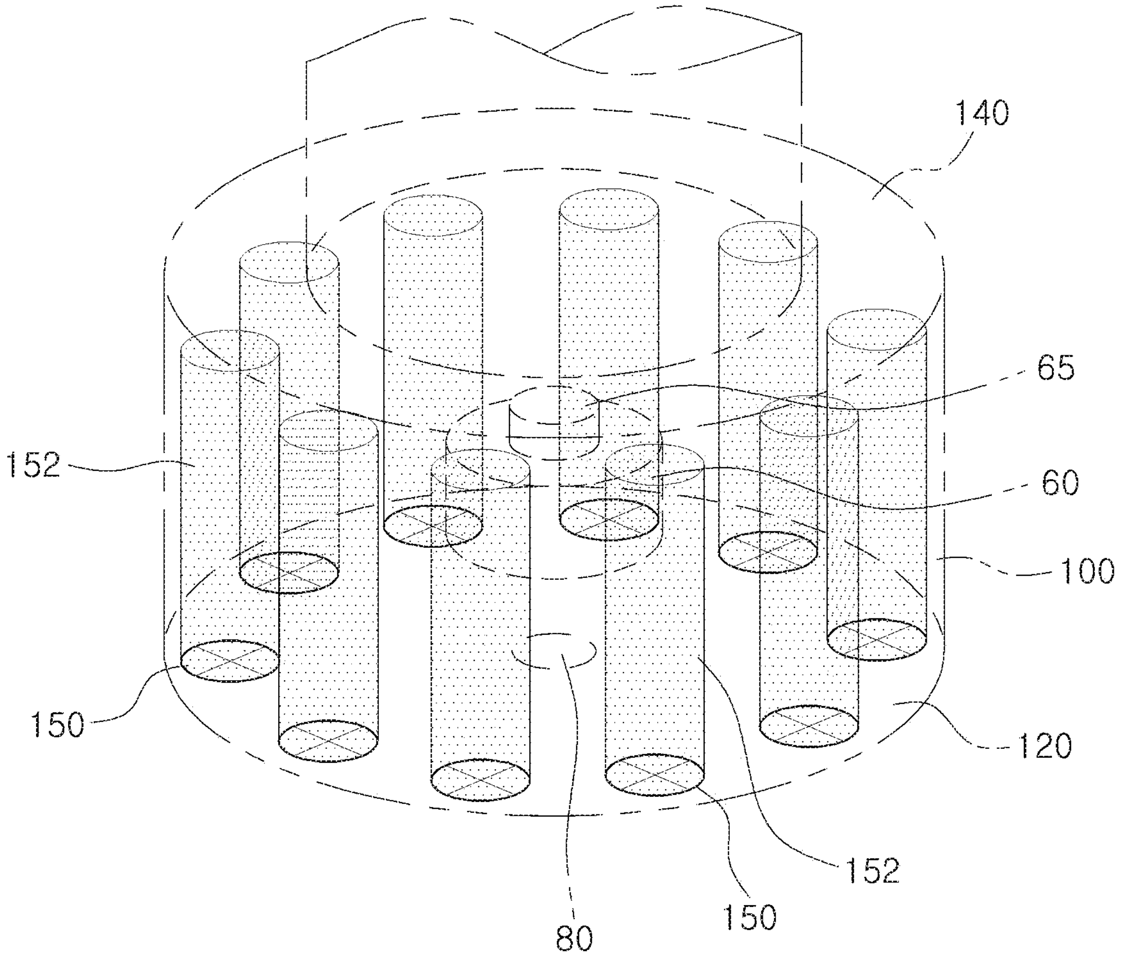
FIG. 5 is a schematic diagram of an activated state of the airbag according to example embodiments in the focused ion beam chamber of FIG. 4.

FIG. 4 is a schematic diagram of a focused ion beam chamber in which an airbag according to according to example embodiments is installed, and FIG. 5 is a schematic diagram of a state in which the airbag according to example embodiments is activated in the focused ion beam chamber of FIG. 4.

Referring to FIGS. 4 and 5, a plurality of airbags 150 according to according to example embodiments may be installed in an outer periphery of the sample stage 60. When air is injected into all of the plurality of airbags 150 and the airbags 150 are inflated, the plurality of inflated airbags 152 may reduce the total volume inside the focused ion beam chamber 100 by the inflated volume of the plurality of airbags. A pump (not shown) may be connected to the air bags and may inject air to inflate the airbags 150.

In example embodiments of inventive concepts, the number of airbags 150 is not particularly limited, and may be a number that does not interfere with the wafer stage 60.

Meanwhile, the sample stage 60 on which the wafer sample 65 is attached may be moved into the focused ion beam chamber 100 from the outside. Therefore, in example embodiments, inflation may not be made until a position of the sample stage 60 is set to not interfere even with movement of the sample stage 60 into the focused ion beam chamber 100.

Figure 6:
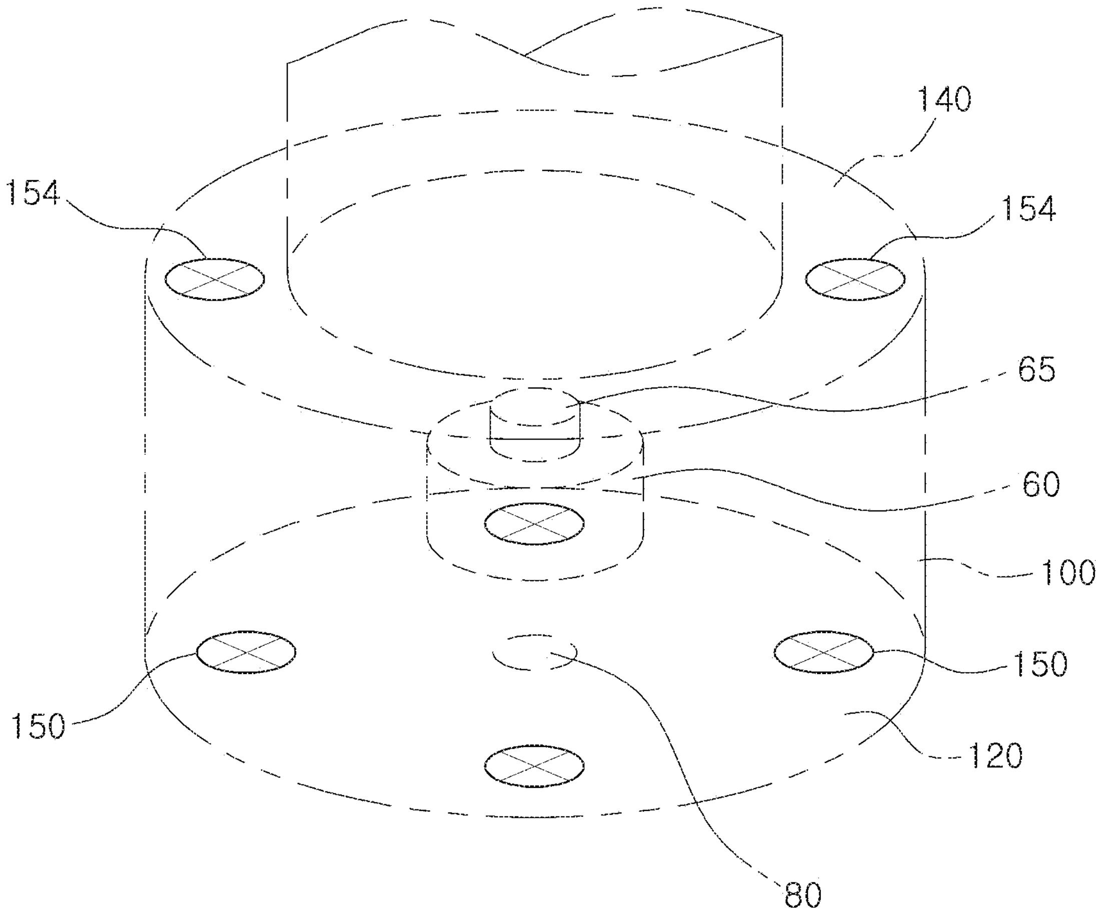
FIG. 6 is a schematic diagram of a focused ion beam chamber equipped with an airbag according to example embodiments.
Figure 7:
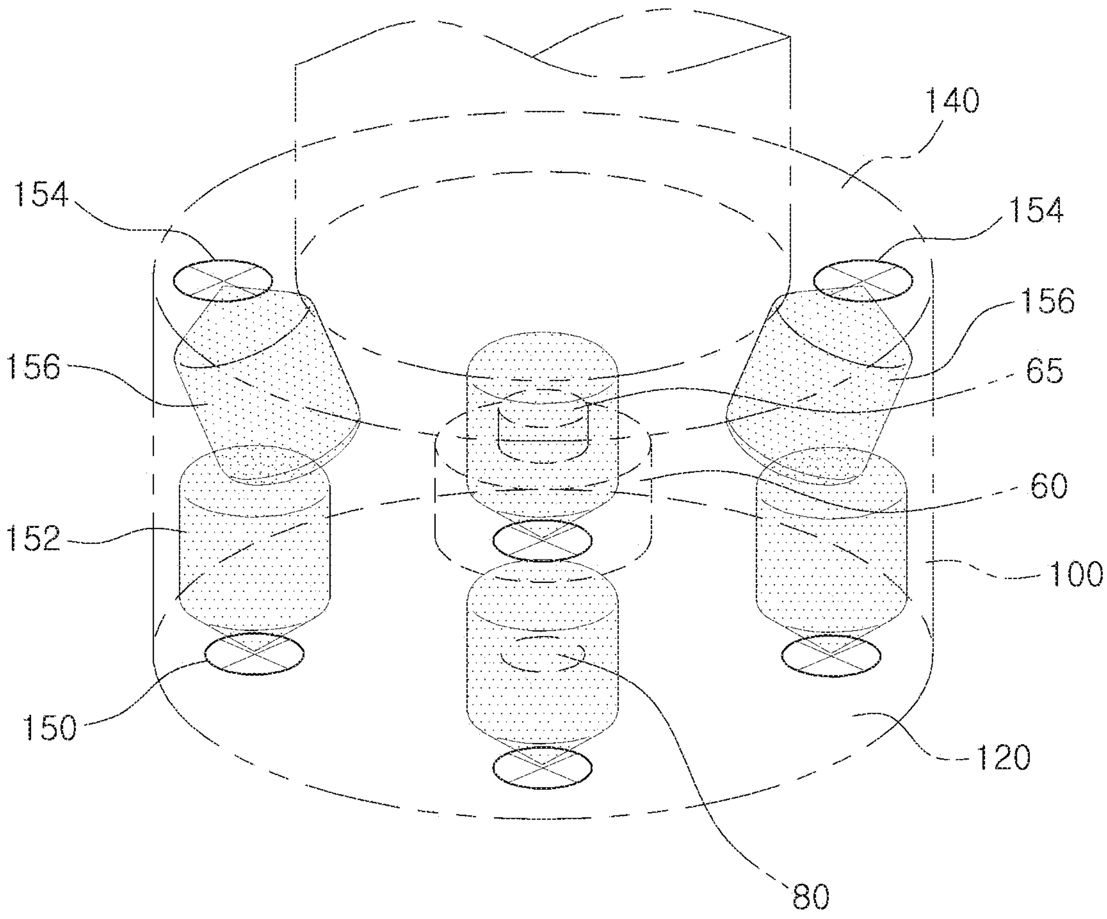
FIG. 7 is a schematic diagram of an activated state of the airbag according to example embodiments in the focused ion beam chamber of FIG. 6.

FIG. 6 is a schematic diagram of a focused ion beam chamber in which an airbag according to example embodiments is installed, and FIG. 7 is a schematic diagram of a state in which an airbag according to according to example embodiments is activated in the focused ion beam chamber of FIG. 6.

Referring to FIGS. 6 and 7, two airbags 154 according to example embodiments may be provided in an upper portion of the focused ion beam chamber and four airbags 150 of the third embodiment are installed in a lower portion. It is illustrated that the airbags 150 and 154 according to example embodiments may be installed in at least one of the upper and lower portions. A single airbag or a plurality of airbags 150 and 154 may be provided, and the number of airbags is not limited as long as the airbags do not interfere with the sample stage 60 to which the wafer sample 65 is attached.

When all the lower airbags 150 and the upper airbags 154 are filled with air and inflated, the plurality of inflated airbags 152 and 156 may reduce the total volume inside the focused ion beam chamber 100 by the inflated volume of the plurality of airbags.

The inflated upper airbag 156 and lower airbag 152 of according to example embodiments may have a balloon shape with narrow ends.

Figure 8:
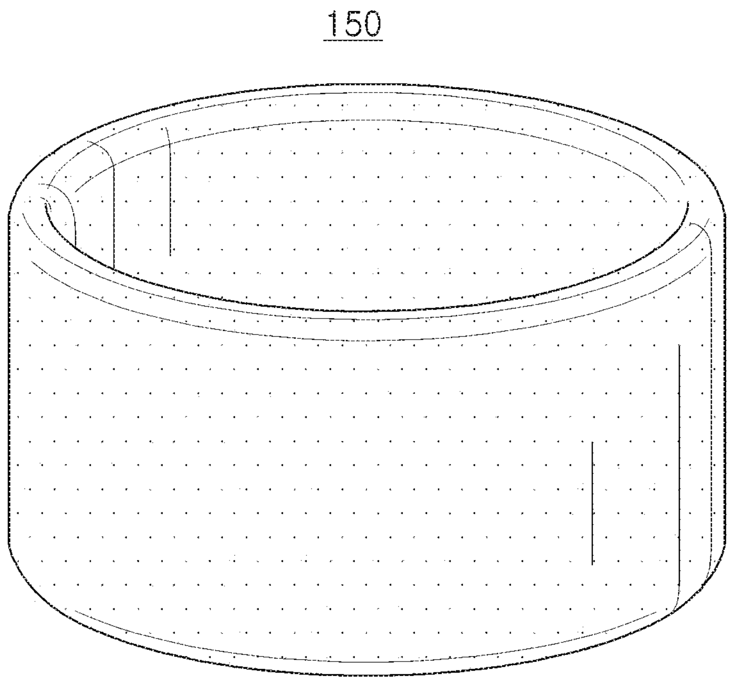
FIGS. 8 to 10 are schematic diagrams illustrating an embodiment of an airbag.
Figure 9:
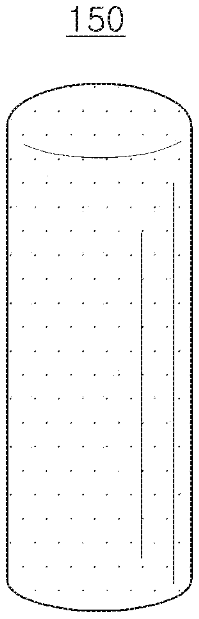
Figure 10:
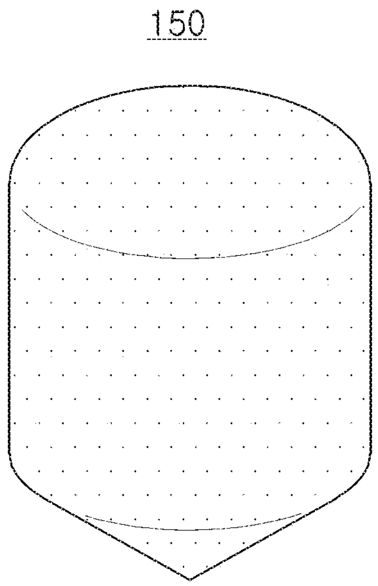

FIGS. 8 to 10 are schematic diagrams illustrating an embodiment of an airbag.

Referring to FIGS. 8 to 10, the shape of the airbag 150 is illustrated, and may be applied to any one of the airbags according to example embodiments described above. The airbag 150 of the embodiment of FIG. 8 has a toroidal shape, the airbag 150 of the embodiment of FIG. 9 has a cylindrical shape, and the airbag 150 of the embodiment of FIG. 10 has a balloon shape.

The shape of the airbag 150 is not particularly limited and the shape is not limited as long as it does not interfere with the sample stage 60 to which the wafer sample 65 is attached.

In the airbag 150 of each of the embodiments described above, an outer surface of the airbag 150 may be coated with a conductive polymer material. The conductive polymer material may adsorb and remove a deposition gas remaining in the focused ion beam chamber 100.

In addition, the conductive polymer material coated on the airbag adsorbs and removes contaminants occurring after milling and deposition of metal ions, such as milling, carbon (C), platinum (Pt), and tungsten (W) in the focused ion beam chamber 10.

A conductive polymer material is a polymer having electrical conductivity, and unlike general organic polymers, the conductive polymer material has electrical, magnetic, and optical properties of metals or semiconductors at the same time. Conductive polymer materials include, for example, poly(p-phenylene), polypyrrol, polythiophene, poly(p-phenylene vinylene), polyacetylene, polyaniline, poly(3,4-ethylenedioxythiophe), etc., and is not particularly limited as long as it is a material that can be adsorbed through combination, for example, hydrogen bonding, π-π interaction, electrostatic interaction, and the like, with carbon or metal contaminants.

When combined with carbon or metal contaminants, the airbag 150 may be contaminated, and thus, the airbag 150 may be installed to be replaceable.

Meanwhile, in the focused ion beam apparatus 1 according to an embodiment of inventive concepts, a pump 80 for evacuating the focused ion beam chamber 100 may be further installed. The pump 80 may evacuate the focused ion beam chamber 100 after the airbag 150 is inflated.

In this manner, after the volume inside the focused ion beam chamber 100 is reduced by the inflation of the airbag 150 in the focused ion beam chamber 100, pumping for evacuation is performed through the pump 80, thereby reducing time for evacuating of the focused ion beam chamber 100.

Control Method of Focused Ion Beam Apparatus

Figure 11:
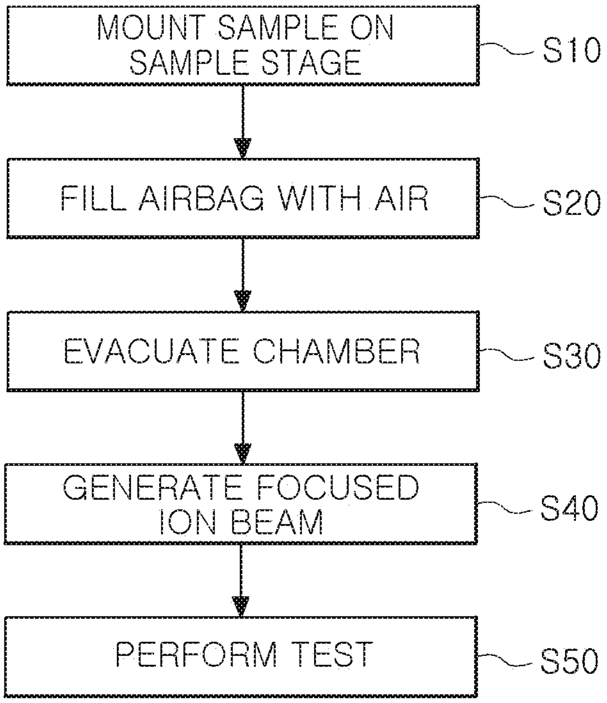
FIG. 11 is a control flowchart for processing a focused ion beam apparatus according to an embodiment of inventive concepts.

FIG. 11 is a control flowchart for processing of a focused ion beam apparatus according to an embodiment of inventive concepts.

Referring to FIG. 11, a control method of a focused ion beam chamber 1 according to an embodiment of inventive concepts may include attaching the wafer sample 65 on the sample stage 60 (S10); filling the airbag 150 with air (S20); and evacuating the focused ion beam chamber 100 after filling the airbag 150 with air (S30).

In the operation of attaching the wafer sample 65 to the sample stage 60 (S10), a process of attaching the wafer sample 65 may be performed when the sample stage 60 is in the focused ion beam chamber 100. Also, the process of attaching the wafer sample 65 may also be performed when the sample stage 60 is outside the focused ion beam chamber 100, and in this case, the sample stage 60 enters the focused ion beam chamber 100 with the wafer sample 65 attached thereto.

When the sample stage 60 is positioned within the focused ion beam chamber 100, the airbag 150 installed in a position that does not interfere with the sample stage 60 is filled with air.

Here, the outer surface of the airbag 150 may be coated with a conductive polymer material to adsorb contaminant molecules remaining in the focused ion chamber 100.

When the airbag 150 is filled with air and inflated, the volume in the focused ion beam chamber 100 may be reduced, thereby shortening an evacuation time.

After evacuation, a focused ion beam is generated (S40), the wafer sample 65 is processed, and a test, such as analysis, is performed on the processed wafer sample with a scanning electron microscope (SEM) (S50).

Also, after testing the wafer sample 65, the contaminated airbag 150 may be replaced.

Such a control method may fill the airbag 150 with air without interfering with the wafer sample 65, and a time for filling the airbag 150 with air may be controlled to come after the wafer sample 65 is mounted on the sample stage 60 in the focused ion beam apparatus, thereby shortening time for evacuation.

According to the focused ion beam apparatus and the control method of the focused ion beam apparatus of inventive concepts, the air bags are installed in the focused ion beam chamber to reduce the volume in the focused ion beam chamber, and then pumping for evacuation is performed, so that time for evacuating the focused ion beam chamber may be reduced.

In addition, by forming a conductive polymer coating layer on the airbag installed in the focused ion beam chamber, molecules remaining in the focused ion beam chamber may be limited and/or prevented from being deposited on the sample, and reliability may be achieved for sample analysis.

In addition, in the focused ion beam apparatus, time for filling the airbag with air may be controlled to come after the safer sample is mounted on the sample stage, thereby shortening time for evacuation.

One or more elements described above may be implemented using processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, a programmable logic unit, a microprocessor, application-specific integrated circuit (ASIC), etc. The processing circuitry may include a memory such as a volatile memory device (e.g., SRAM, DRAM, SDRAM) and/or a non-volatile memory (e.g., flash memory device, phase-change memory, ferroelectric memory device).

While example embodiments have been illustrated and described above, it will be apparent to those skilled in the art that modifications and variations could be made without departing from the scope of inventive concepts as defined by the appended claims.

What is claimed is:

1. A focused ion beam apparatus comprising:

an ion beam emitter configured to emit an ion beam;

a focused ion beam chamber for having ion gas introduced therein;

a sample stage in the focused ion beam chamber, the sample stage being configured to support a wafer sample; and an airbag in the focused ion beam chamber, the airbag arranged to not interfere with the sample stage, wherein the airbag is spaced apart from an outer edge of the sample stage in an outer periphery of the sample stage, and the airbag is configured to inflate before evacuating the focused ion beam chamber to reduce an effective volume being evacuated in the focused ion beam chamber.

2. The focused ion beam apparatus of claim 1, wherein the airbag is among a plurality of airbags in the outer periphery of the sample stage, and each of the plurality of airbags is spaced apart from the outer edge of the sample stage.

3. The focused ion beam apparatus of claim 1, wherein the airbag is in one of an upper portion of the focused ion beam chamber and a lower portion of the focused ion beam chamber, or the airbag is among a plurality of airbags in at least one of the upper portion of the focused ion beam chamber and the lower portion of the focused ion beam chamber.

4. The focused ion beam apparatus of claim 1, wherein the airbag is installed to be replaceable.

5. The focused ion beam apparatus of claim 1, wherein the airbag includes at least one of a toroidal airbag, a cylindrical airbag, or an elongated inflatable airbag having a rounded end.

6. The focused ion beam apparatus of claim 1, wherein a conductive polymer material is on an outer surface of the airbag.

7. The focused ion beam apparatus of claim 1, further comprising:

a pump configured to evacuate the focused ion beam chamber.

8. A focused ion beam apparatus comprising:

a focused ion beam chamber in which a sample stage configured to support a wafer sample is disposed; and an airbag in the focused ion beam chamber, the airbag being configured to inflate before evacuating the focused ion beam chamber to reduce an effective volume being evacuated in the focused ion beam chamber, the airbag is spaced apart from an outer edge of the sample stage in an outer periphery of the sample stage.

9. The focused ion beam apparatus of claim 8, further comprising:

a pump configured to evacuate the focused ion beam chamber after the airbag is inflated.

10. The focused ion beam apparatus of claim 8, wherein one or a plurality of airbags are in the focused ion beam chamber at one or more respective positions that do not interfere with the sample stage.

11. The focused ion beam apparatus of claim 8, wherein the airbag is in one of an upper portion of the focused ion beam chamber and a lower portion of the focused ion beam chamber, or the airbag is among a plurality of airbags in at least one of the upper portion of the focused ion beam chamber and the lower portion of the focused ion beam chamber.

12. The focused ion beam apparatus of claim 8, wherein the airbag is installed to be replaceable.

13. The focused ion beam apparatus of claim 8, wherein the airbag includes at least one of a toroidal airbag, a cylindrical airbag, or an elongated inflatable airbag having a rounded end.

14. The focused ion beam apparatus of claim 8, wherein a conductive polymer material is on an outer surface of the airbag.

15. A method of controlling a focused ion beam apparatus, the method comprising:

attaching a wafer sample on a sample stage in a focused ion beam chamber;

filling an airbag with air, the airbag being installed in a position in the focused ion beam chamber that does not interfere with the sample stage; and evacuating the focused ion beam chamber after filling the airbag with air, wherein the airbag is spaced apart from an outer edge of the sample stage in an outer periphery of the sample stage, wherein the airbag is configured to inflate before evacuating the focused ion beam chamber to reduce an effective volume being evacuated in the focused ion beam chamber.

16. The method of claim 15, wherein an outer surface of the airbag is coated with a conductive polymer material to adsorb contaminant molecules remaining in the focused ion beam chamber.

17. The method of claim 15, wherein one or a plurality of airbags are installed in a position that does not interfere with the sample stage and inflated when filled with air to reduce a volume inside the focused ion beam chamber.

18. The method of claim 15, wherein one or a plurality of airbags are installed in at least one of an upper portion and a lower portion of the focused ion beam chamber and inflated when filled with air to reduce a volume inside the focused ion beam chamber.

19. The method of claim 15, further comprising:

after the evacuating the focused ion beam chamber, generating a focused ion beam to process the wafer sample such that a processed wafer sample is provided; and testing the processed wafer sample.

20. The method of claim 19, further comprising:

replacing the airbag with another airbag in the focused ion beam chamber after the testing the processed wafer sample.

* * * * *